United States Patent
Han et al.

(10) Patent No.: US 12,484,351 B2
(45) Date of Patent: Nov. 25, 2025

(54) DISPLAY DEVICE INCLUDING AN AUXILIARY LAYER

(71) Applicant: SAMSUNG DISPLAY CO., LTD., Yongin-si (KR)

(72) Inventors: Jae-Bum Han, Suwon-si (KR); Young Gil Park, Asan-si (KR); Jung Hwa Park, Hwaseong-si (KR); Na Ri Ahn, Seongnam-si (KR); Soo Im Jeong, Hwaseong-si (KR); Ki Nam Kim, Hwaseong-si (KR); Moon Sung Kim, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/641,481

(22) Filed: Apr. 22, 2024

(65) Prior Publication Data

US 2024/0379918 A1    Nov. 14, 2024

Related U.S. Application Data

(63) Continuation of application No. 17/843,052, filed on Jun. 17, 2022, now Pat. No. 11,967,669, which is a
(Continued)

(30) Foreign Application Priority Data

Aug. 30, 2019   (KR) .................. 10-2019-0107688

(51) Int. Cl.
*H01L 33/58*   (2010.01)
*H01L 27/12*   (2006.01)
(Continued)

(52) U.S. Cl.
CPC .......... *H10H 20/855* (2025.01); *H10D 62/80* (2025.01); *H10D 86/423* (2025.01);
(Continued)

(58) Field of Classification Search
CPC ............... H01L 23/52; H01L 23/53295; H01L 27/1225; H01L 27/12; H01L 27/1237;
(Continued)

(56) References Cited

U.S. PATENT DOCUMENTS 9,082,857 B2   7/2015   Yamazaki et al.
9,236,455 B2   1/2016   Jo et al.
(Continued)

FOREIGN PATENT DOCUMENTS

JP   2015-149489 A2   8/2015
JP   2018-006729      1/2018
(Continued)

*Primary Examiner* — Nikolay K Yushin
(74) *Attorney, Agent, or Firm* — F. CHAU & ASSOCIATES, LLC

(57) ABSTRACT

A display device is provided including a substrate. A second semiconductor layer is disposed on the substrate. The second semiconductor layer includes Si. A second gate lower electrode overlaps a channel region of the second semiconductor layer. A second gate insulating layer is disposed on the second gate lower electrode. A second gate upper electrode and a light blocking layer are disposed on the second gate insulating layer. A first auxiliary layer is disposed on the second gate upper electrode and the light blocking layer. A first semiconductor layer overlaps the light blocking layer. The first semiconductor layer includes an oxide semiconductor. A first gate electrode overlaps a channel region of the first semiconductor layer. The first auxiliary layer includes an insulating layer including at least one compound selected from SiNx, SiOx, and SiON, and at least one material selected from F, Cl, and C.

16 Claims, 15 Drawing Sheets

Related U.S. Application Data continuation of application No. 16/941,102, filed on Jul. 28, 2020, now Pat. No. 11,367,815.

(51) Int. Cl.

| | | |
|---|---|---|
| *H01L 29/24* | (2006.01) | |
| *H10D 62/80* | (2025.01) | |
| *H10D 86/40* | (2025.01) | |
| *H10D 86/60* | (2025.01) | |
| *H10H 20/832* | (2025.01) | |
| *H10H 20/855* | (2025.01) | |

(52) U.S. Cl.
CPC .......... *H10D 86/431* (2025.01); *H10D 86/60* (2025.01); *H10H 20/832* (2025.01)

(58) Field of Classification Search
CPC ... H01L 27/1248; H01L 27/156; H01L 27/15; H01L 27/124; H01L 27/1214; H01L 29/24; H01L 29/16; H01L 29/18; H01L 29/20; H01L 29/22; H01L 29/78648; H01L 29/786; H01L 29/78633; H01L 29/78696; H01L 29/78612; H01L 29/78621; H01L 29/78651; H01L 29/78606; H01L 29/78645; H01L 29/7869; H01L 33/58; H01L 33/40; H10K 50/865; H10K 50/86; H10K 59/1213; H10K 59/124; H10K 59/121; H10K 99/00; H10H 20/855; H10H 20/832; H10H 29/142; H10H 29/14; H10D 62/80; H10D 62/834; H10D 62/822; H10D 86/423; H10D 86/40; H10D 86/431; H10D 86/60; H10D 86/441; H10D 30/6734; H10D 30/67; H10D 30/6723; H10D 86/451; H10D 30/6743; H10D 30/6755; H10D 30/6757; H10D 30/6708; H10D 30/6715

See application file for complete search history.

(56) References Cited

U.S. PATENT DOCUMENTS

| | | | |
|---|---|---|---|
| 9,397,194 | B2 | 7/2016 | Yamazaki et al. |
| 9,653,358 | B2 | 5/2017 | Zhong et al. |
| 10,128,381 | B2 | 11/2018 | Yamazaki et al. |
| 10,134,878 | B2 | 11/2018 | Hsu et al. |
| 10,622,432 | B2 | 4/2020 | Kim et al. |
| 11,367,815 | B2 | 6/2022 | Han et al. |
| 11,380,795 | B2 | 7/2022 | Yamazaki et al. |
| 11,757,041 | B2 | 9/2023 | Yamazaki et al. |
| 12,142,688 | B2 | 11/2024 | Yamazaki et al. |
| 2012/0043593 | A1 | 2/2012 | Zhong et al. |
| 2018/0308916 | A1 | 10/2018 | Kim et al. |
| 2019/0214447 | A1 | 7/2019 | Kim et al. |
| 2021/0066555 | A1 | 3/2021 | Han et al. |
| 2022/0320391 | A1 | 10/2022 | Han et al. |

FOREIGN PATENT DOCUMENTS

| | | |
|---|---|---|
| JP | 2018-125340 | 8/2018 |
| KR | 10-2015-0107622 | 9/2015 |
| KR | 10-2016-0102309 A | 8/2016 |
| KR | 10-2018-0119192 | 11/2018 |

DISPLAY DEVICE INCLUDING AN AUXILIARY LAYER

CROSS-REFERENCE TO RELATED APPLICATIONS

This application is a continuation of U.S. patent application Ser. No. 17/843,052 filed on Jun. 17, 2022, which is a continuation of U.S. patent application Ser. No. 16/941,102 filed on Jul. 28, 2020, now U.S. Pat. No. 11,367,815, which claims priority under 35 U.S.C. § 119 to Korean Patent Application No. 10-2019-0107688 filed in the Korean Intellectual Property Office on Aug. 30, 2019, the entire disclosures of which are incorporated by reference herein in their entireties.

(a) TECHNICAL FIELD OF THE INVENTION

The present invention relates to a display device, and more particularly, to a display device including an auxiliary layer.

(b) DISCUSSION OF THE RELATED ART

A display panel may include a plurality of pixels and a driving circuit for controlling the pixels. The driving circuit may include at least one thin film transistor. The thin film transistor constituting the driving circuit supplies electrical signals for controlling the pixels to the corresponding pixels.

Each of the pixels may include a pixel driving circuit and a display element connected to the pixel driving circuit. The pixel driving circuit may include at least one thin film transistor and a capacitor. The thin film transistor and capacitor constituting the pixel driving circuit control the display element depending on the electrical signals supplied from the driving circuit.

SUMMARY

According to an exemplary embodiment of the present invention, a display device is provided including a substrate. A second semiconductor layer is disposed on the substrate. The second semiconductor layer includes Si. A second gate lower electrode overlaps a channel region of the second semiconductor layer. A second gate insulating layer is disposed on the second gate lower electrode. A second gate upper electrode and a light blocking layer are disposed on the second gate insulating layer. A first auxiliary layer is disposed on the second gate upper electrode and the light blocking layer. A first semiconductor layer overlaps the light blocking layer. The first semiconductor layer includes an oxide semiconductor. A first gate electrode overlaps a channel region of the first semiconductor layer. The first auxiliary layer includes an insulating layer including at least one compound selected from SiNx, SiOx, and SiON, and at least one material selected from F, Cl, and C.

According to an exemplary embodiment of the present invention, a content of the at least one material selected from F, Cl, and C included in the first auxiliary layer is three times or more greater than at least material from F, Cl, and C included in the second gate insulating layer.

According to an exemplary embodiment of the present invention, a thickness of the first auxiliary layer is in a range of 1 Å to 100 Å.

According to an exemplary embodiment of the present invention, the second gate upper electrode and the light blocking layer include a same material.

According to an exemplary embodiment of the present invention, the light blocking layer overlaps the first semiconductor layer and has an area similar to that of the first semiconductor layer.

According to an exemplary embodiment of the present invention, a third gate insulating layer is disposed between the first semiconductor layer and the first gate electrode. The third gate insulating layer overlaps the first semiconductor layer.

According to an exemplary embodiment of the present invention, a third gate insulating layer is disposed between the first semiconductor layer and the first gate electrode. The third gate insulating layer overlaps the channel region of the first semiconductor layer and does not overlap a source region and a drain region of the first semiconductor layer.

According to an exemplary embodiment of the present invention, a second auxiliary layer is disposed on the first gate electrode. The second auxiliary layer includes an insulating layer including at least one compound selected from SiNx, SiOx, and SiON, and at least one material selected from F, Cl, and C. A content of the at least one material selected from F, Cl, and C included in the second auxiliary layer is three times or more greater than at least one material selected from F, Cl, and C included in the second gate insulating layer.

According to an exemplary embodiment of the present invention, a third gate insulating layer is disposed between the first semiconductor layer and the first gate electrode. The third gate insulating layer overlaps the first semiconductor layer.

According to an exemplary embodiment of the present invention, a third gate insulating layer is disposed between the first semiconductor layer and the first gate electrode. The third gate insulating layer overlaps the channel region of the first semiconductor layer and does not overlap a source region and a drain region of the first semiconductor layer.

According to an exemplary embodiment of the present invention, a third auxiliary layer is disposed between the second gate lower electrode and the second gate insulating layer. The third auxiliary layer includes an insulating layer including at least one compound selected from SiNx, SiOx, and SiON, and at least one material selected from F, Cl, and C. A content of the at least one material selected from F, Cl, and C included in the third auxiliary layer is three times or more greater than the at least one material selected from F, Cl, and C included in the second gate insulating layer.

According to an exemplary embodiment of the present invention, a third gate insulating layer is disposed between the first semiconductor layer and the first gate electrode. The third gate insulating layer overlaps the first semiconductor layer.

According to an exemplary embodiment of the present invention, a third gate insulating layer is disposed between the first semiconductor layer and the first gate electrode. The third gate insulating layer overlaps the channel region of the first semiconductor layer and does not overlap a source region and a drain region of the first semiconductor layer.

According to an exemplary embodiment of the present invention, a second auxiliary layer is disposed on the first gate electrode. A third auxiliary layer is disposed between the second gate lower electrode and the second gate insulating layer. Each of the second auxiliary layer and the third auxiliary layer includes an insulating layer including at least one compound selected from SiNx, SiOx, and SiON, and at least one material selected from F, Cl, and C. A content of the at least one material selected from F, Cl, and C included in the second auxiliary layer and the third auxiliary layer is three times or more greater than at least one material selected from F, Cl, and C included in the second gate insulating layer.

According to an exemplary embodiment of the present invention, a third gate insulating layer is disposed between the first semiconductor layer and the first gate electrode. The third gate insulating layer overlaps the first semiconductor layer.

According to an exemplary embodiment of the present invention, a third gate insulating layer is disposed between the first semiconductor layer and the first gate electrode. The third gate insulating layer overlaps the channel region of the first semiconductor layer and does not overlap a source region and a drain region of the first semiconductor layer.

According to an exemplary embodiment of the present invention, a display device is provided including a substrate. A first transistor and a second transistor are disposed on the substrate. The first transistor includes a first semiconductor layer. The first semiconductor layer includes an oxide semiconductor and a first gate electrode. The second transistor includes a second semiconductor layer. The second semiconductor layer includes a Si semiconductor, a second gate lower electrode and a second gate upper electrode. A first auxiliary layer is disposed between the second gate upper electrode and the first semiconductor layer, and the first auxiliary layer includes an insulating layer and at least one material selected from F, Cl, and C.

According to an exemplary embodiment of the present invention, a light blocking layer is disposed on a same layer as the second gate upper electrode. The first auxiliary layer is disposed on the second gate upper electrode and the light blocking layer.

According to an exemplary embodiment of the present invention, a second auxiliary layer is disposed on the first gate electrode. The second auxiliary layer includes an insulating layer including at least one compound selected from SiNx, SiOx, and SiON, and at least one material selected from F, Cl, and C.

According to an exemplary embodiment of the present invention, a third auxiliary layer is disposed between the second gate lower electrode and the second gate upper electrode. The third auxiliary layer includes an insulating layer including at least one compound selected from SiNx, SiOx, and SiON, and at least one material selected from F, Cl, and C.

According to an exemplary embodiment of the present invention, a display device is provided including a substrate. A transistor is disposed on the substrate. The transistor includes an oxide semiconductor layer. An auxiliary layer is disposed on the transistor. The auxiliary layer includes an insulating layer and at least one carrier material. The at least one carrier material is configured to migrate to the semiconductor layer during an on-current.

DETAILED DESCRIPTION OF THE EXEMPLARY EMBODIMENTS

Figure 1:
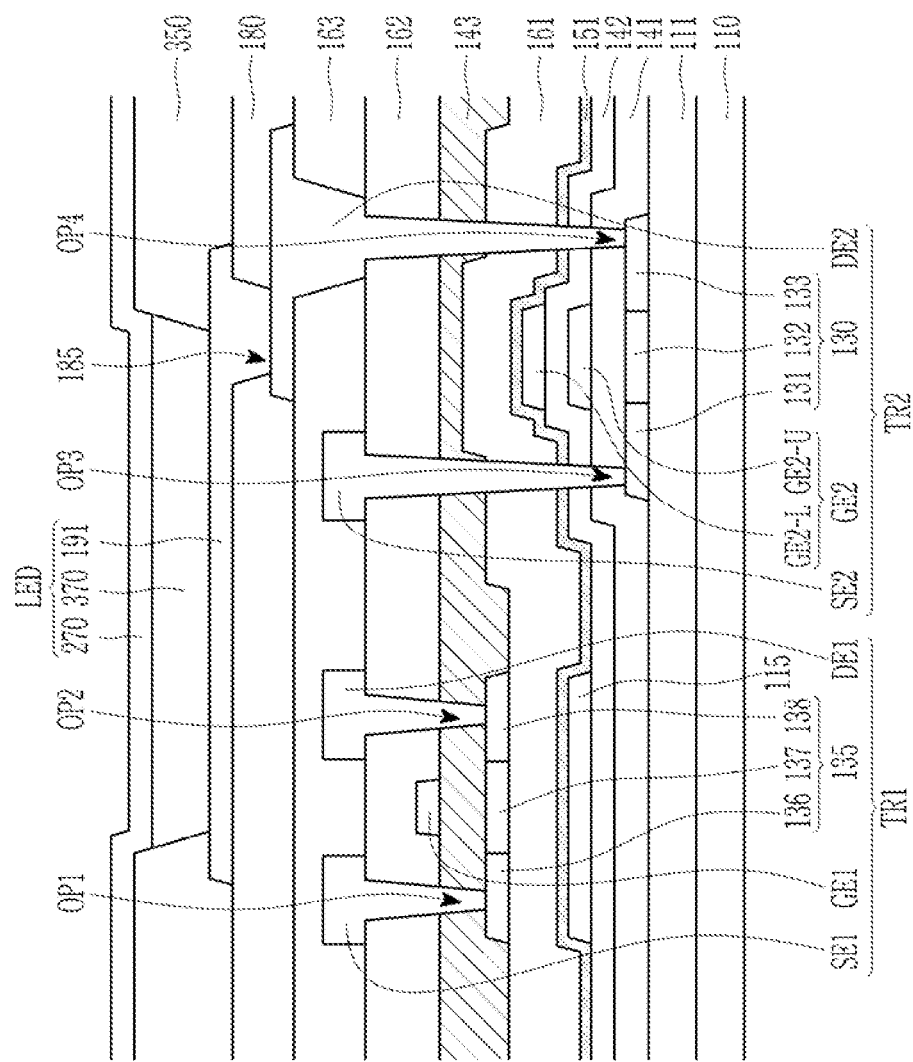
FIG. 1 schematically illustrates a cross-sectional view showing a portion of a display device according to an exemplary embodiment of the present invention.

The present invention will be described more fully hereinafter with reference to the accompanying drawings, in which exemplary embodiments of the present invention are shown.

In the drawings, the thicknesses and dimensions of layers, films, panels, regions, etc., may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

A display device according to an exemplary embodiment of the present invention will now be described in detail with reference to the accompanying drawings.

FIG. 1 schematically illustrates a cross-sectional view showing a portion of a display device according to an exemplary embodiment of the present invention. FIG. 1 mainly illustrates a light emitting device (LED) connected to a first transistor TR1, a second transistor TR2, and a second transistor TR2 in the display device. The first transistor TR1 may be a switching transistor. The second transistor TR2 may be a driving transistor.

A buffer layer 111 is disposed on a substrate 110. The substrate 110 may include at least one compound selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that can be bent or folded, and may be a single layer or multiple layers.

The buffer layer 111 may have a single or multi-layered structure. Although the buffer layer 111 is illustrated as a single layer in FIG. 1, the buffer layer 111 may be a multilayer depending on an exemplary embodiment, and may include an organic insulating material or an inorganic insulating material. For example, the buffer layer 111 may include a silicon nitride, a silicon oxide, and/or silicon oxynitride.

A second semiconductor layer 130 is disposed on the buffer layer 111. The second semiconductor layer 130 may include amorphous silicon, polycrystalline silicon, and/or single crystal silicon. The second semiconductor layer 130 may include a source region 131, a channel region 132, and a drain region 133.

The source region 131 of the second semiconductor layer 130 is connected to a second source electrode SE2, and the drain region 133 of the second semiconductor layer 130 is connected to a second drain electrode DE2.

A first gate insulating layer 141 is disposed on the second semiconductor layer 130. The first gate insulating layer 141 may include a silicon nitride and/or a silicon oxide.

A second gate lower electrode GE2-U is disposed on the first gate insulating layer 141. A second gate insulating layer 142 is disposed on the second gate lower electrode GE2-U. The second gate insulating layer 142 may include a silicon nitride and/or a silicon oxide.

A second gate upper electrode GE2-L is disposed on the second gate insulating layer 142. The second gate lower electrode GE2-U and the second gate upper electrode GE2-L overlap each other (e.g., in a thickness direction) with the second gate insulating layer 142 interposed therebetween. The second gate upper electrode GE2-L and the second gate lower electrode GE2-U constitute a second gate electrode GE2. The second gate electrode GE2 overlaps the channel region 132 of the second semiconductor layer 130 in a direction that is perpendicular to an upper surface of the substrate 110 (e.g., the thickness direction).

The second semiconductor layer 130, the second gate electrode GE2, the second source electrode SE2 and the second drain electrode DE2 constitute the second transistor TR2. As will be described later, the second transistor TR2 may be a driving transistor connected with the light emitting device LED.

Referring back to FIG. 1, a light blocking layer 115 is disposed on the second gate insulating layer 142. The light blocking layer 115 is disposed on a same layer as the second gate upper electrode GE2-L. The light blocking layer 115 may be formed by a same process as the second gate upper electrode GE2-L and may include a same material. An upper surface of the light blocking layer 115 may be disposed at a lower level than an upper surface of the gate upper electrode GE2-L. The second gate upper electrode GE2-L and the light blocking layer 115 may include a same material and have a same thickness. The light blocking layer 115 overlaps the first semiconductor layer 135 and has an area similar to that of the first semiconductor layer 135.

A first auxiliary layer 151 is disposed on upper surfaces of the light blocking layer 115, the second gate upper electrode GE2-L, and exposed upper surfaces of the second gate insulating layer 142 with a corresponding shape. The first auxiliary layer 151 may include fluorine. For example, first auxiliary layer 151 may include SiNx, SiOx, and/or SiON and fluorine. For example, the first auxiliary layer 151 may include SiNx:F, SiOx:F, or SiON:F. In addition, the first auxiliary layer 151 may include Cl and/or C. For example, first auxiliary layer 151 may include SiNx:Cl, SiNx:C, SiOx:Cl, SiOx:C, SiON:C, and/or SiON:Cl. Subscript x may be an integer between 1 to 4.

For example, the first auxiliary layer 151 may include an insulating layer including at least one compound selected from SiNx, SiOx, and SiON, and a carrier. For example, the carrier may be at least one material selected from F, Cl, and C included in the insulating layer. In an exemplary embodiment of the present invention, the first auxiliary layer 151 may include F, and may further include Cl and/or C in addition to F.

As such, the first auxiliary layer 151 including at least one material selected from F, Cl, and C may increase the on current by supplying a carrier to the first transistor TR1.

For example, a content of fluorine contained in the first auxiliary layer 151 may be three times or more greater than that of the second gate insulating layer 142 or the first insulating layer 161. Even when the first auxiliary layer 151 includes C and/or Cl, a content of C and/or Cl included in the first auxiliary layer 151 may be three times or more greater than the content of C and/or Cl of the second gate insulating layer 142 or the first insulating layer 161.

A thickness of the first auxiliary layer 151 may be 1 Å to 100 Å. When the thickness of the first auxiliary layer is greater than 100 Å, it may affect an interface characteristic of each layer, and too many carriers may be supplied to the first transistor TR1.

A first insulating layer 161 is disposed on the first auxiliary layer 151. The first insulating layer 161 may include a silicon nitride and/or a silicon oxide. For example, the first insulating layer 161 may be a multilayer including a SiNx layer and/or a SiOx layer. In the first insulating layer 161, the layer including SiNx may be disposed closer to the substrate than the layer including SiOx.

A first semiconductor layer 135 is disposed on the first insulating layer 161.

The first semiconductor layer 135 may include an oxide semiconductor. The oxide semiconductor may include at least one compound selected from a primary metal-based oxide such as an indium oxide, a tin oxide, or a zinc oxide, a binary metal-based oxide such as an In—Zn-based oxide, an Sn—Zn-based oxide, an Al—Zn-based oxide, a Zn—Mg-based oxide, an Sn—Mg-based oxide, an In—Mg-based oxide, and/or an In—Ga-based oxide, a ternary metal-based oxide such as an In—Ga—Zn-based oxide, an In—Al—Zn-based oxide, an In—Sn—Zn-based oxide, an Sn—Ga—Zn-based oxide, an Al—Ga—Zn-based oxide, an Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a quaternary metal-based oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and/or an In—Hf—Al—Zn-based oxide. For example, the first semiconductor layer 135 may include an indium-gallium-zinc oxide (IGZO) in the In—Ga—Zn-based oxide.

The first semiconductor layer 135 may include a source region 136, a channel region 137, and a drain region 138. The source region 136 of the first semiconductor layer 135 is connected to a first source electrode SE1, and the drain region 138 of the first semiconductor layer 135 is connected to a first drain electrode DE1.

A third insulating layer 143 is disposed on the first semiconductor layer 135. In the exemplary embodiment of the present invention depicted in FIG. 1, the third gate insulating layer 143 may be disposed on an entire upper surface of the first insulating layer 161 and the first semiconductor layer 135. However, the third gate insulating layer 143 may be disposed only between the first gate electrode GE1 and the first semiconductor layer 135. For example, the third gate insulating layer 143 may overlap the channel region 137 of the first semiconductor layer 135, and may not overlap the source region 136 or the drain region 138.

A first gate electrode GE1 is disposed on the third gate insulating layer 143. The first gate electrode GE1 may overlap the channel region 137 of the first semiconductor layer 135 in a direction that is perpendicular to the substrate 110 (e.g., the thickness direction).

The first gate electrode GE1, the first semiconductor layer 135, the first source electrode SE1, and the first drain electrode DE1 constitute the first transistor TR1. The first transistor TR1 may be a switching transistor for switching the second transistor TR2.

A second insulating layer 162 is disposed on the first gate electrode GE1. A first source electrode SE1, a first drain electrode DE1, and a second source electrode SE2 are disposed on the second insulating layer 162.

The first source electrode SE1 is connected to the source region 136 of the first semiconductor layer 135 through a first opening OP1. The first drain electrode DE1 is connected to the drain region 138 of the first semiconductor layer 135 through a second opening OP2.

The second source electrode SE2 is connected to the source region 131 of the second semiconductor layer 130 through a third opening OP3.

A third insulating layer 163 is disposed on upper surfaces of the first source electrode SE1, the first drain electrode DE1, and the second source electrode SE2.

A second drain electrode DE2 is disposed on the third insulating layer 163. The second drain electrode DE2 is connected to the drain region 133 of the second semiconductor layer 130 through a fourth opening OP4. In FIG. 1, a configuration in which the first source electrode SE1, the first drain electrode DE1, the second source electrode SE2, and the second drain electrode DE2 are disposed on different layers is illustrated, but they may be disposed on a same layer. For example, the second drain electrode DE2 may be connected to a first electrode 191 through a separate connecting member.

A fourth insulating layer 180 is disposed on the second drain electrode DE2. The first electrode 191 and the second drain electrode DE2 are in contact with each other in an opening 185 of the fourth insulating layer 180. A partition wall 350 is disposed on the first electrode 191, and an opening of the partition wall 350 overlaps the first electrode 191. A light emitting element layer 370 is disposed in the opening of partition wall 350. A second electrode 270 is disposed on the light emitting element layer 370 and the partition wall 350. The first electrode 191, the light emitting element layer 370, and the second electrode 270 constitute a light emitting diode LED.

As described above, in the display device according to the exemplary embodiment of the present invention depicted in FIG. 1, the first transistor TR1, which is a switching transistor, includes an oxide semiconductor, and the second transistor TR2, which is a driving transistor, includes a silicon semiconductor. As such, the switching transistor and the driving transistor may include different semiconductor materials, thereby driving it more stably and having high reliability.

Figure 2:
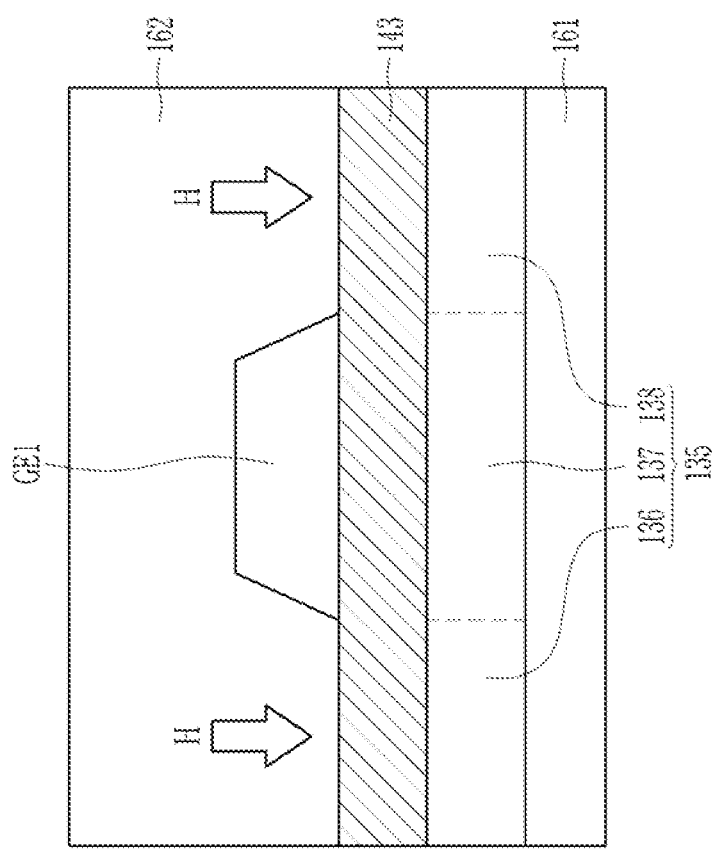
FIG. 2 illustrates a portion of a first transistor TR1 of FIG. 1.

However, sufficient carriers may not be supplied to the first semiconductor layer 135 of the first transistor TR1 including the oxide semiconductor. FIG. 2 illustrates a portion of a first transistor TR1 of FIG. 1.

Referring to FIG. 2, a material such as H, which may act as a carrier for the first semiconductor layer 135, may be blocked by the third gate insulating layer 143 so as not to be supplied to the first semiconductor layer 135. Therefore, the on current of the first transistor TR1 may be reduced during reliability evaluation.

However, the display device according to the exemplary embodiment of the present invention adds a first auxiliary layer 151, which is rich in carriers, such as fluorine, to supply the carriers to the first semiconductor layer 135 and to increase the on current of the first transistor TR1.

Figure 3:
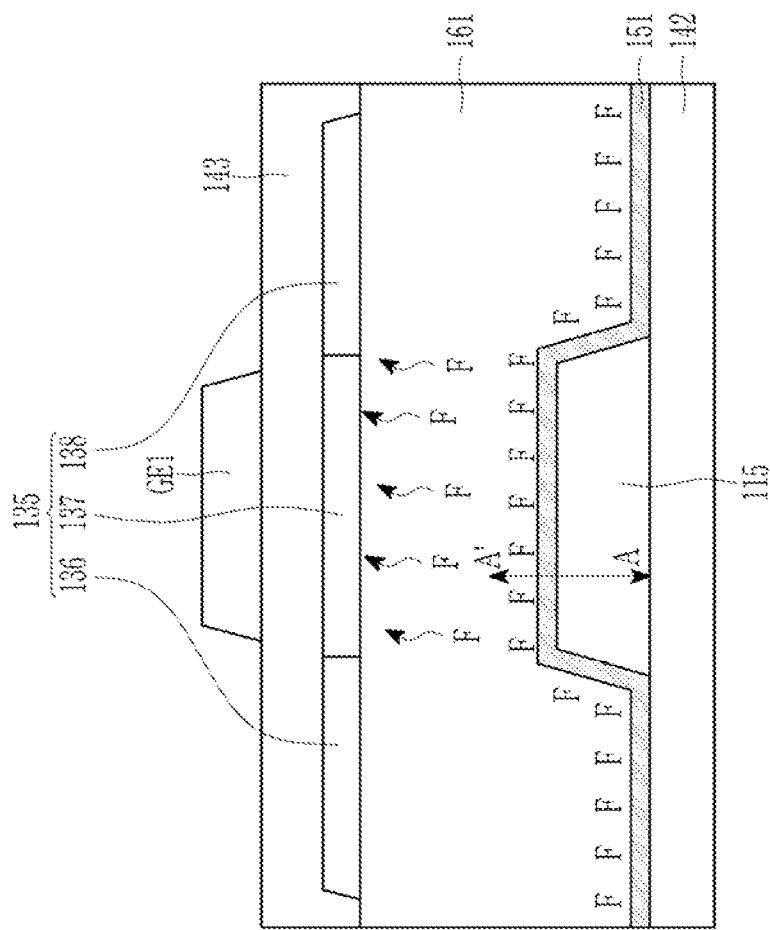
FIG. 3 illustrates a principle in which a carrier is supplied to a first semiconductor layer in a display device according to an exemplary embodiment of the present invention.

FIG. 3 illustrates a principle in which a carrier is supplied to the first semiconductor layer 135 in the display device according to an exemplary embodiment of the present invention. Referring to FIG. 3, in the display device according to the present exemplary embodiment, F is released from the first auxiliary layer 151, which is rich in F, and is supplied to the first semiconductor layer 135. FIG. 3 illustrates a case where it is rich in F, but the first auxiliary layer 151 may further include Cl, C, etc. in addition to F, and such a material may also act as a carrier.

Figure 4:
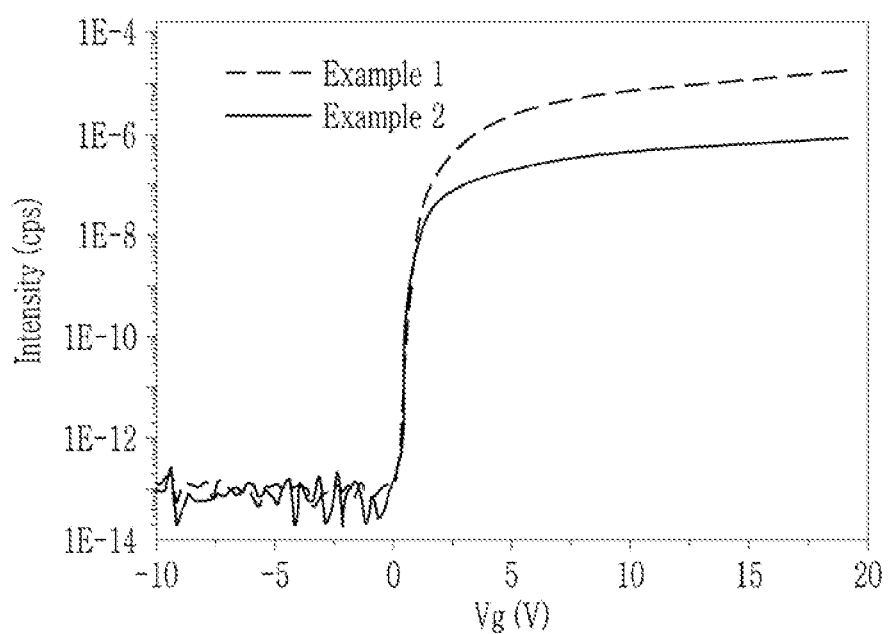
FIG. 4 illustrates measurement results of on currents when a first auxiliary layer is included (Example 1) and when no first auxiliary layer is included (Example 2) in the display device according to an exemplary embodiment of the present invention.

FIG. 4 illustrates measurement results of on currents when a first auxiliary layer is included (Example 1) and when no first auxiliary layer is included (Example 2) in the display device according to an exemplary embodiment of the present invention. Referring to FIG. 4, in the display device according to the present exemplary embodiment of the present invention, the on current increases when the first auxiliary layer is included.

Figure 5:
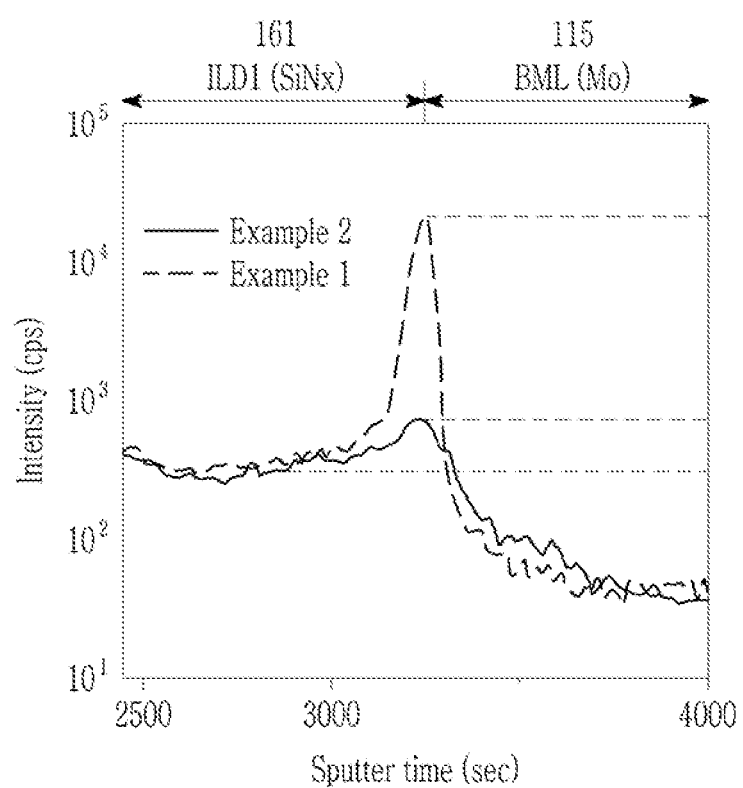
FIG. 5 illustrates measurement results of fluorine concentration when a first auxiliary layer is included (Example 1) and when no first auxiliary layer is included (Example 2)

FIG. 5 illustrates measurement results of fluorine concentration when a first auxiliary layer is included (Example 1) and when no first auxiliary layer is included (Example 2). Referring to FIG. 5, it is confirmed that the fluorine concentration (e.g., the intensity in counts-per-second (cps)) is high when the first auxiliary layer 151 was included (Example 1) at an interface between the light blocking layer 115 and the first insulating layer 161.

Figure 6:
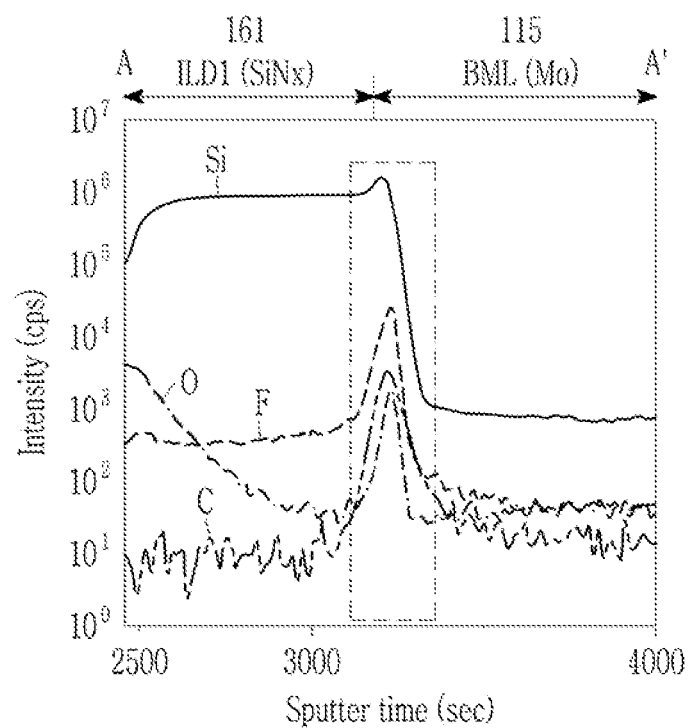
FIG. 6 illustrates concentrations of Si, O, F, and C measured along the line AA' of FIG. 3.

FIG. 6 illustrates concentrations of Si, O, F, and C measured along the line A-A' of FIG. 3. Referring to FIG. 6, it is seen that a concentration of F increases and a concentration of C increases in the first auxiliary layer 151, which is an interface between the light blocking layer 115 and the first insulating layer 161. An area of the first auxiliary layer 151 is illustrated as a dotted rectangle. As such, the material such as F or C included in the first auxiliary layer 151 may be supplied to the first semiconductor layer 135 to act as a carrier.

Figure 7:
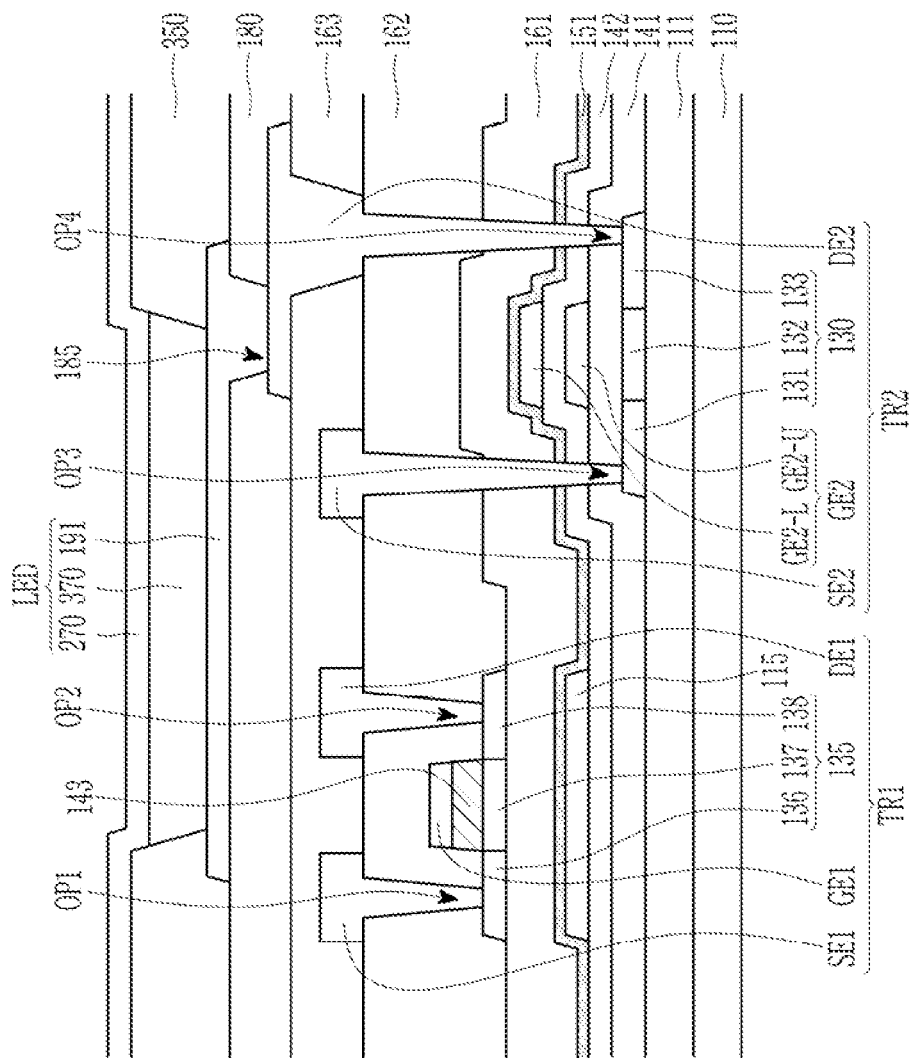
FIG. 7 illustrates a cross-section corresponding to that of FIG. 1 according to an exemplary embodiment of the present invention.

FIG. 7 illustrates a cross-section for a display device according to an exemplary embodiment of the present invention. Referring to FIG. 7, the display device is different from that of the exemplary embodiment of the present invention depicted in FIG. 1 in that the third gate insulating layer 143 is disposed only in an area overlapping the first gate electrode GE1. As illustrated in FIG. 7, even when the third gate insulating layer 143 is disposed only between the first gate electrode GE1 and the first semiconductor layer 135 (e.g., channel region 137), the carrier may be supplied to the first semiconductor layer 135 through the first auxiliary layer 151 to increase the on current.

Figure 8:
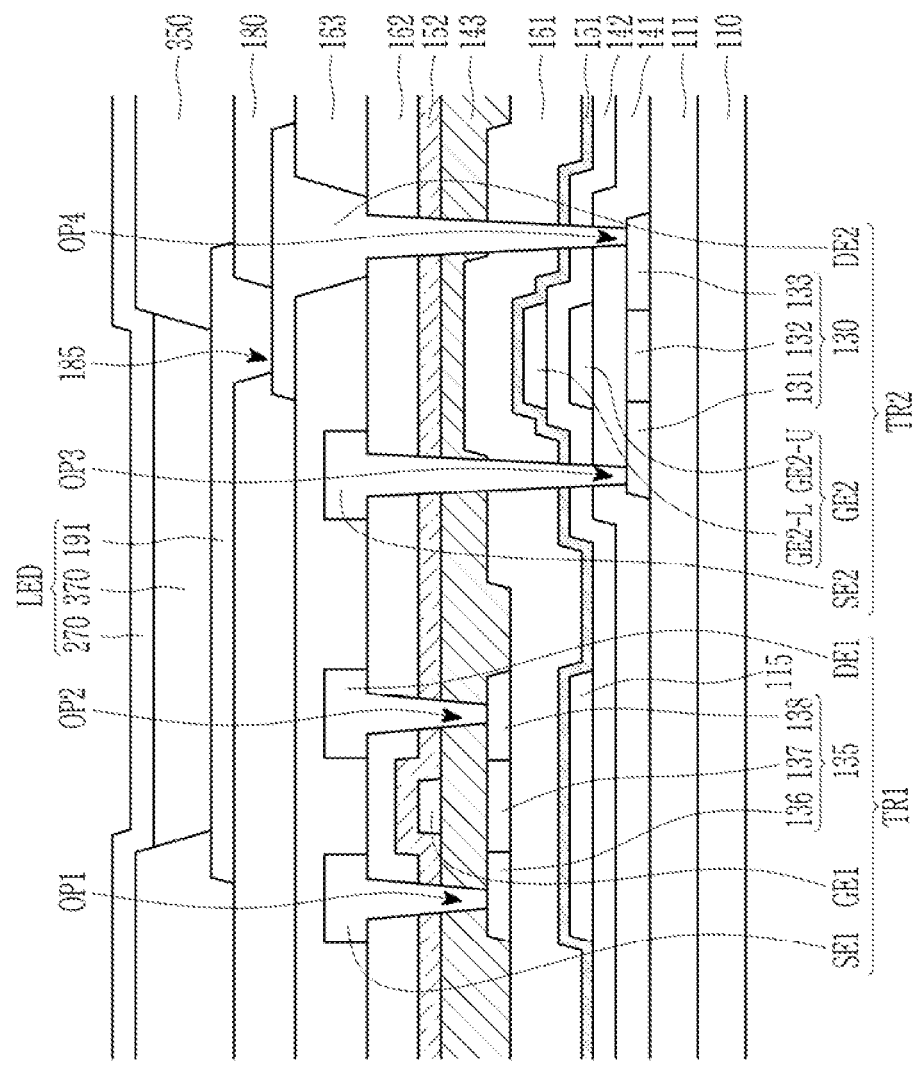
FIG. 8 illustrates a cross-section corresponding to that of FIG. 1 according to an exemplary embodiment of the present invention.

FIG. 8 illustrates a cross-section for a display device according to an exemplary embodiment of the present invention. Referring to FIG. 8, the display device according is the same as the exemplary embodiment of the present invention depicted in FIG. 1, except for further including a second auxiliary layer 152 disposed between the first gate electrode GE1 and the second insulating layer 162. The second auxiliary layer 162 may also be disposed across an upper surface of the third gate insulating layer 143.

The second auxiliary layer 152 may include fluorine. For example, the second auxiliary layer 152 may include SiNx, SiOx, and/or SiON containing fluorine. For example, the second auxiliary layer 152 may include SiNx:F, SiOx:F, and/or SiON:F. In addition, the second auxiliary layer 152 may include Cl and/or C. For example, the second auxiliary layer 152 may include SiNx:Cl, SiNxC, SiOx:Cl, SiOx:C, SiON:C, or SiON:Cl. The subscript x may be an integer between 1 and 4. A thickness of the second auxiliary layer 152 may be 1 Å to 100 Å. Hereinafter, a description of the second auxiliary layer 152 is the same as that of the first auxiliary layer 151.

As described above, in the display device according to the exemplary embodiment of the present invention depicted in FIG. 8, since carriers are supplied from both the first auxiliary layer 151 and the second auxiliary layer 152, the on current of the first semiconductor layer 135 may be further increased.

Figure 9:
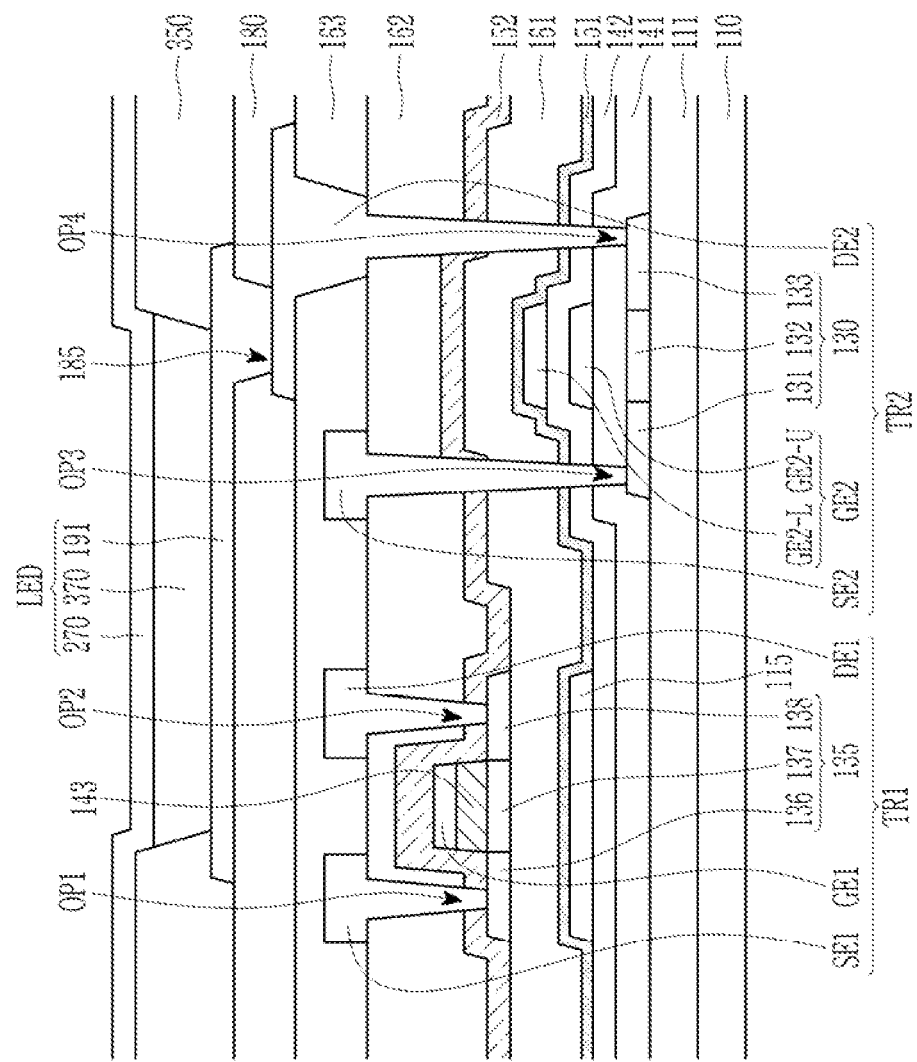
FIG. 9 illustrates a cross-section for a display device according to an exemplary embodiment of the present invention.
Figure 10:
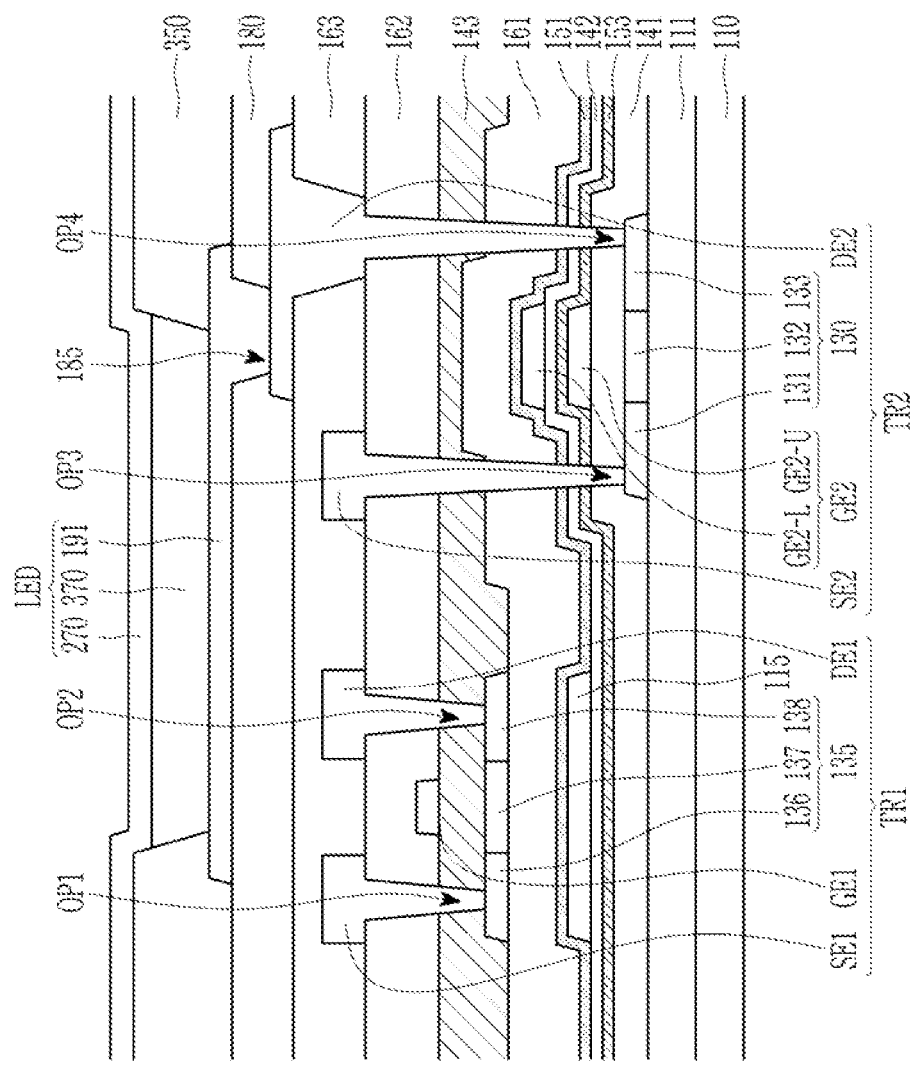
FIG. 10 illustrates a cross-section for a display device according to an exemplary embodiment of the present invention.

FIG. 9 illustrates a cross-section for a display device according to an exemplary embodiment of the present invention. Referring to FIG. 9, the display device is the same as that of the exemplary embodiment of the present invention depicted in FIG. 8, except that the third gate insulating layer 143 is disposed only in an area overlapping the first gate electrode GE1. FIG. 10 illustrates a cross-section for a display device according to an exemplary embodiment of the present invention. Referring to FIG. 10, the display device is the same as the exemplary embodiment of the present invention depicted in FIG. 1 except for further including a third auxiliary layer 153 disposed between the second gate electrode GE2-U and the second gate insulating layer 142 and between the second gate insulating layer 142 and the first gate insulating layer 141. The third auxiliary layer 153 may include fluorine. For example, the third auxiliary layer 153 may include SiNx, SiOx, and/or SiON containing fluorine. For example, the third auxiliary layer 153 may include SiNx:F, SiOx:F, and/or SiON:F. In addition, the third auxiliary layer 153 may include Cl and/or C. For example, the third auxiliary layer 153 may include SiNx:Cl, SiNx:C, SiOx:Cl, SiOx:C, SiON:C, and/or SiON:Cl. The subscript x may be an integer between 1 to 4. A thickness of the third auxiliary layer 153 may be 1 Å to 100 Å. Hereinafter, a description of the third auxiliary layer 153 is the same as that of the first auxiliary layer 151.

In the display device according to the exemplary embodiment of FIG. 10, since carriers are supplied from both the first auxiliary layer 151 and the third auxiliary layer 153, the on current of the first semiconductor layer 135 may be further increased.

Figure 11:
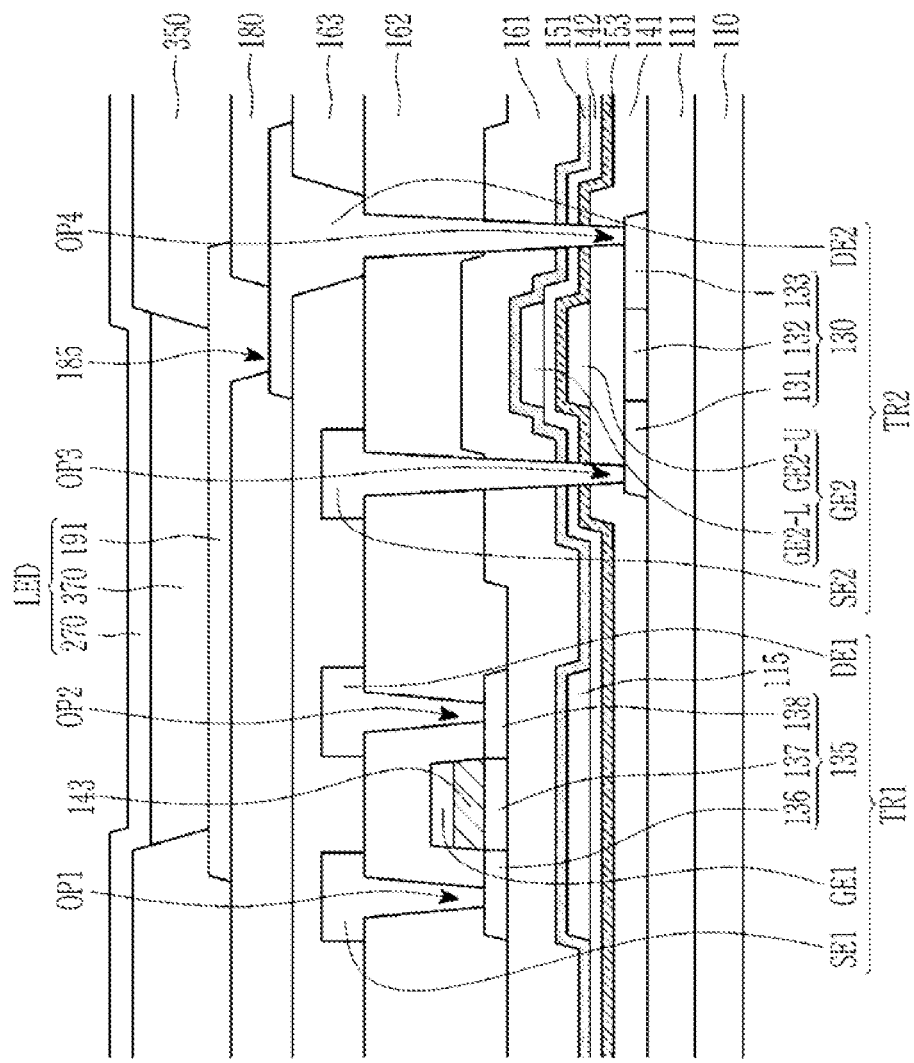
FIG. 11 illustrates a cross-section for a display device according to an exemplary embodiment of the present invention.

FIG. 11 illustrates a cross-section for a display device according to an exemplary embodiment of the present invention. Referring to FIG. 11, the display device is the same as that of the exemplary embodiment of the present invention depicted in FIG. 10, except that the third gate insulating layer 143 is disposed only in an area overlapping the first gate electrode GE1.

Figure 12:
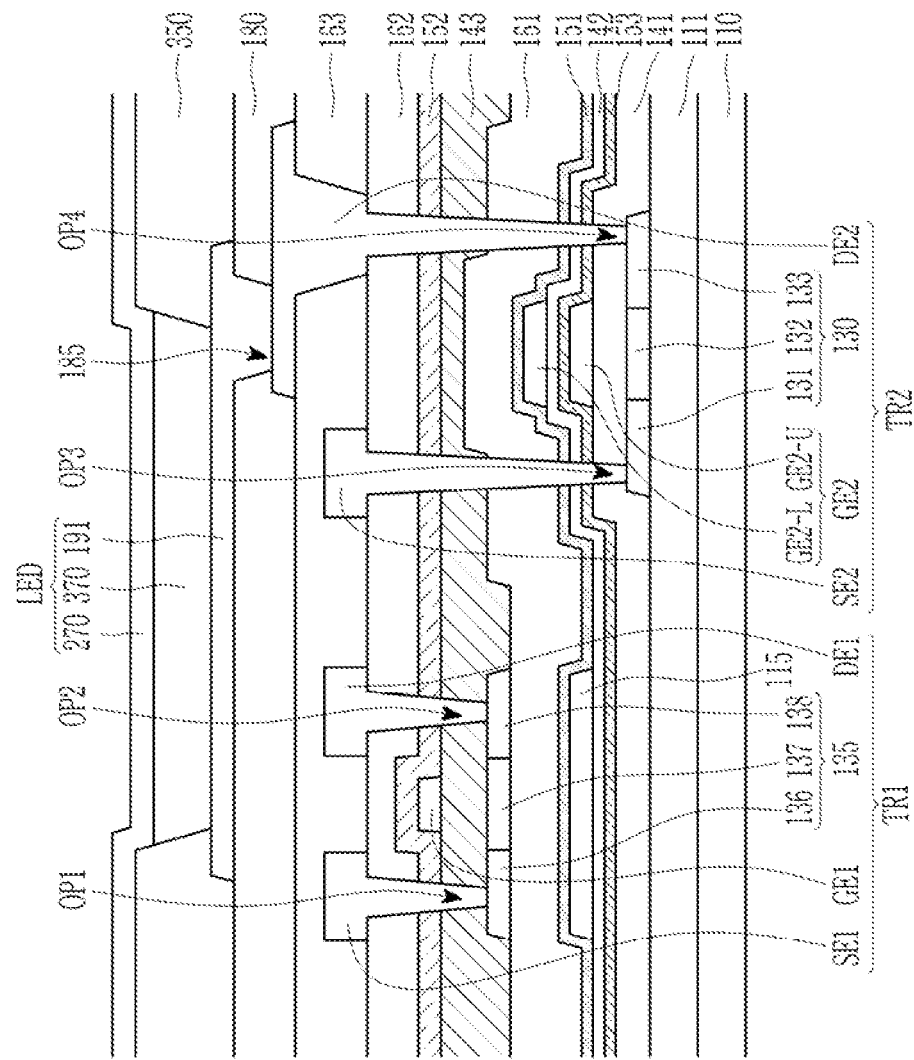
FIG. 12 illustrates a cross-section for a display device according to an exemplary embodiment of the present invention.

FIG. 12 illustrates a cross-section for a display device according to an exemplary embodiment of the present invention. Referring to FIG. 12, the display device is the same as the exemplary embodiment of the present invention depicted in FIG. 1, except for further including a second auxiliary layer 152 disposed between the first gate electrode GE1 and the third insulating layer 163 and a third auxiliary layer 153 disposed between the second gate electrode GE2-U and the second gate insulating layer 142.

Figure 13:
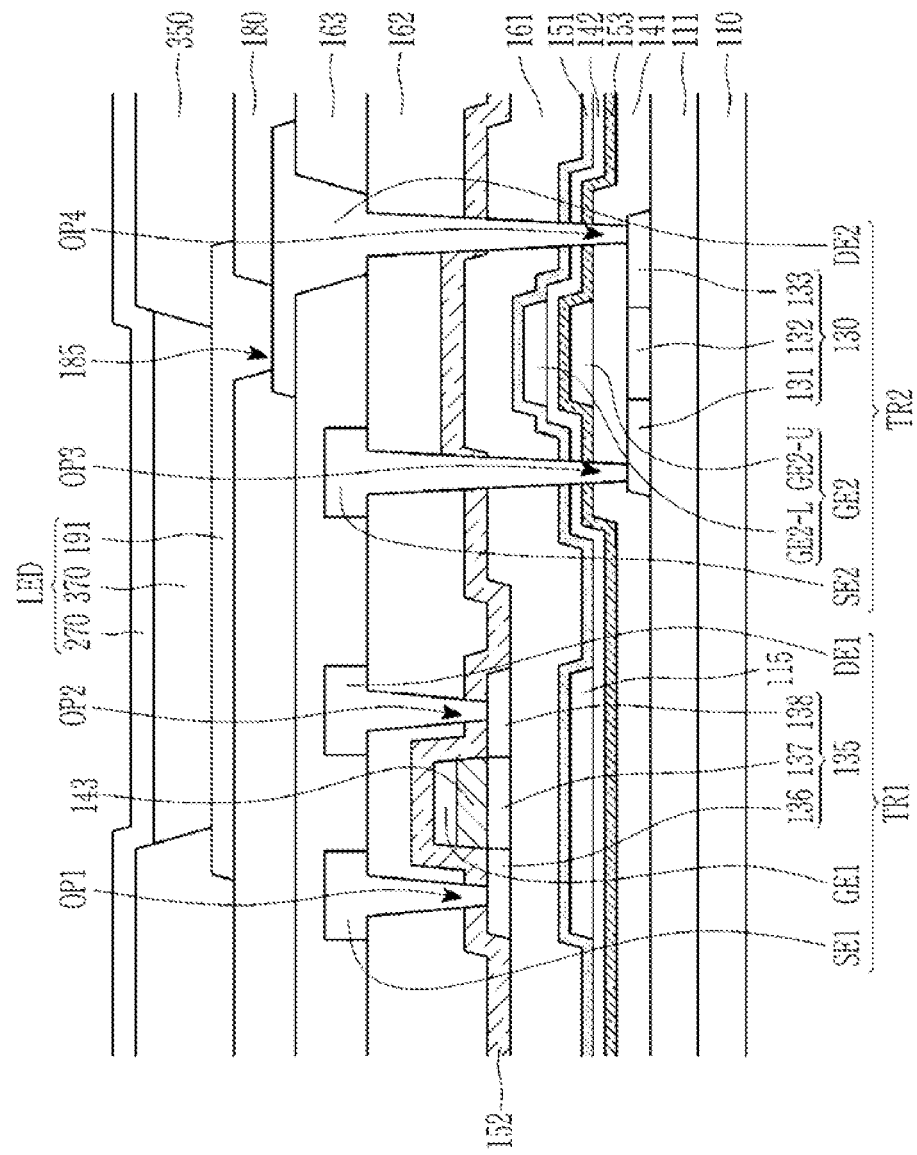
FIG. 13 illustrates a cross-section for a display device according to an exemplary embodiment of the present invention.
Figure 14:
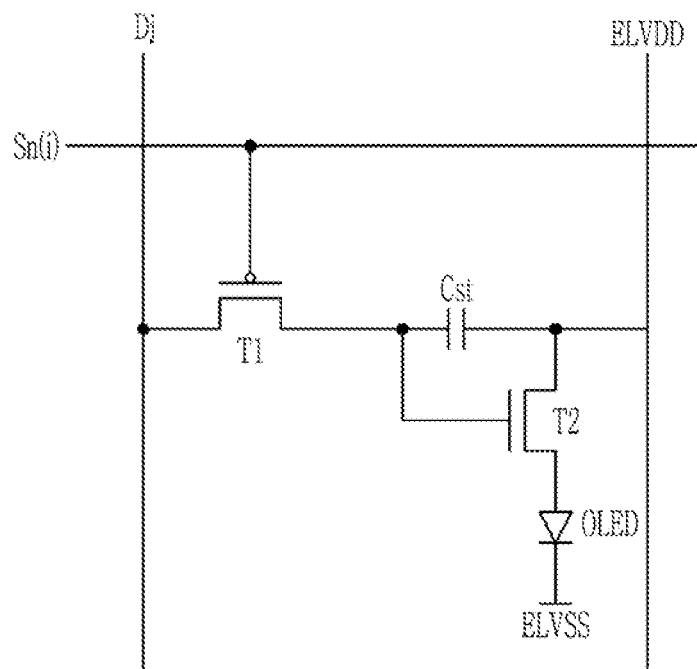
FIG. 14 illustrates circuit diagram of a display device according to an exemplary embodiment of the present invention.

FIG. 13 illustrates a cross-section for a display device according to an exemplary embodiment of the present invention. Referring to FIG. 13, the display device is the same as that of the exemplary embodiment of the present invention depicted in FIG. 12, except that the third gate insulating layer 143 is disposed only in an area overlapping the first gate electrode GE1. For example, the third gate insulating layer 143 may be disposed between the first gate electrode GE1 and the first semiconductor layer 135. Hereinafter, a circuit diagram of the display device according to an exemplary embodiment of the present invention will be described. FIG. 14 illustrates a circuit diagram of a display device according to an exemplary embodiment of the present invention.

Referring to FIG. 14, a pixel circuit includes a second transistor T2 for controlling the light emitting device LED (e.g., the organic light emitting device (OLED)), a first transistor T1 for switching the second transistor T2, and a capacitor Cst connected with the first power line ELVDD.

In FIG. 14, the first transistor T1 may be a switching transistor, and the second transistor T2 may be a driving transistor. The first transistor T1 of FIG. 14 may correspond to the first transistor TR1 of FIG. 1 to FIG. 13, and the second transistor T2 may correspond to the second transistor TR2 of FIG. 1 to FIG. 13.

The first transistor T1 may include a gate electrode, a source electrode, and a drain electrode. The gate electrode of the first transistor T1 may be connected to an $i^{th}$ scan line Sn(i), and the source electrode may be connected to a $j^{th}$ data line Dj. The drain electrode of the first transistor T1 may be connected to the gate electrode of the second transistor T2. The first transistor T1 may transfer the data signal applied to the $j^{th}$ data line Dj to the second transistor T2 depending on the scan signal applied to the $i^{th}$ scan line Sn(i).

The second transistor T2 may include a gate electrode, a source electrode, and a drain electrode. In the second transistor T2, the gate electrode may be connected to the first transistor T1, the source electrode may be connected to the first power line ELVDD, and the drain electrode may be connected to the organic light emitting diode OLED.

The organic light emitting diode OLED may include an emission layer, and an anode electrode and a cathode electrode facing each other with the emission layer therebetween. The anode electrode may be connected to the drain electrode of the second transistor T2. The cathode electrode may be connected to the second power line ELVSS to apply a common voltage. The emission layer may display an image by emitting light or not emitting light depending on an output signal of the second transistor T2.

Herein, light emitted from the light emitting layer may vary depending on a material of the emission layer, and may be colored light or white light.

The capacitor Cst may be connected between the gate electrode and the source electrode of the second transistor T2 to charge and maintain a data signal inputted into the gate electrode of the second transistor T2.

Although FIG. 14 illustrates that the pixel circuit includes two transistors T1 and T2 and one capacitor Cst, the present invention is not limited thereto, and it may include one thin film transistor and a capacitor, or three or more transistors and two or more capacitors. For example, as illustrated in FIG. 15, the pixel circuit may include first to seventh transistors T1 to T7 and a capacitor Cst.

Figure 15:
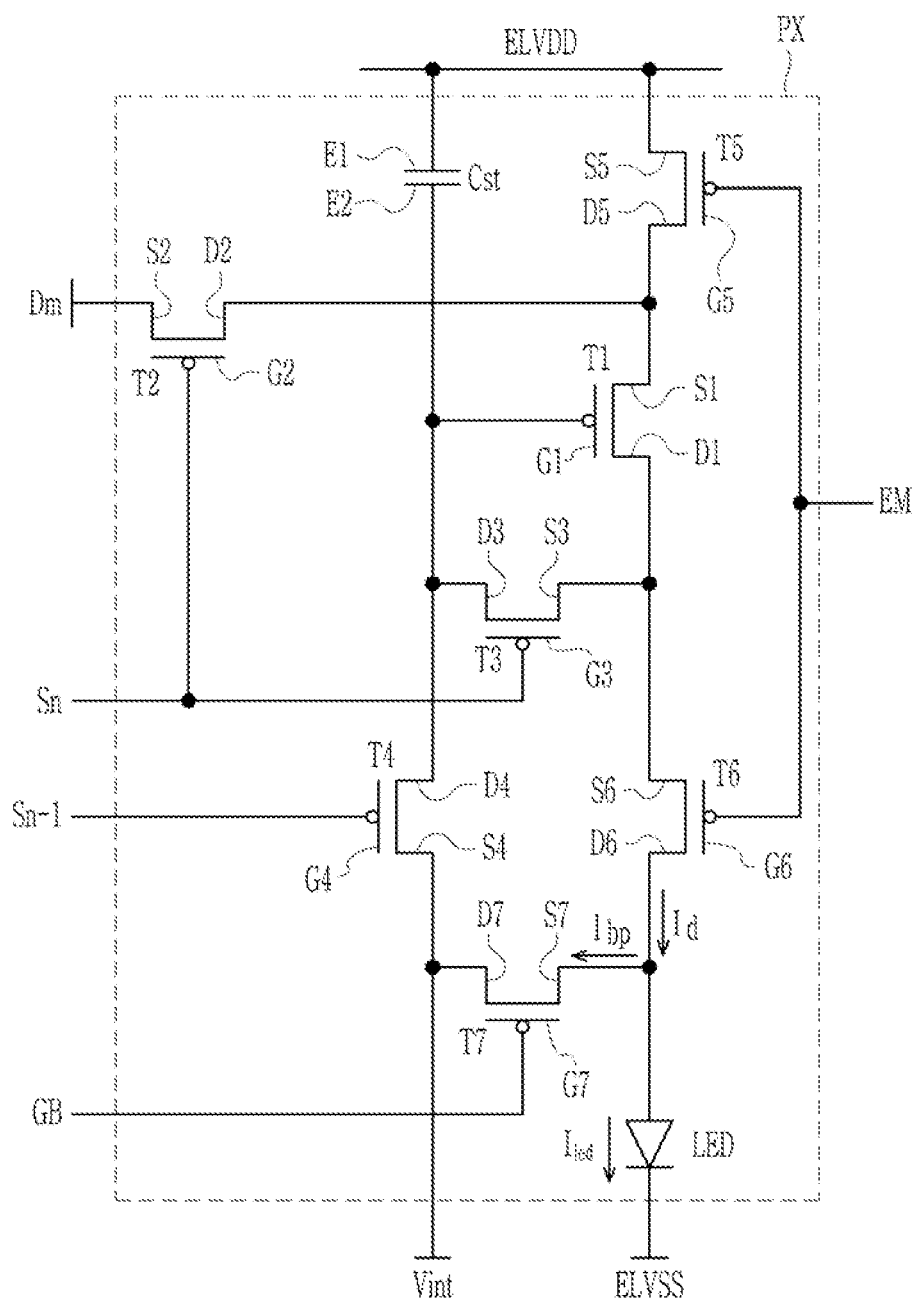
FIG. 15 illustrates circuit diagram of a display device according to an exemplary embodiment of the present invention.

FIG. 15 illustrates circuit diagram of a display device according to an exemplary embodiment of the present invention. Referring to FIG. 15, a pixel PX of an emissive display device includes a plurality of transistors T1, T2, T3, T4, T5, T6, and T7, a storage capacitor Cst, and a light emitting diode connected to various signal lines.

The emissive display device includes a display area in which an image is displayed, and such pixels PX are arranged in various shapes in the display area.

The transistors T1, T2, T3, T4, T5, T6, and T7 include a driving transistor T1, switching transistors, i.e., a second transistor T2 and a third transistor T3, connected with a scan line Sn, and other transistors (hereinafter referred to as compensation transistors) for performing an operation required to operate the light emitting diode LED. These compensation transistors T4, T5, T6, and T7 may include a fourth transistor T4, a fifth transistor T5, a sixth transistor T6, and a seventh transistor T7.

A plurality of signal lines include a scan line Sn, a previous-stage scan line Sn−1, a light emission control line EM, a bypass control line GB, a data line Dm, a driving voltage line ELVDD, an initialization voltage line Vint, and a common voltage line ELVSS. The bypass control line GB may be a portion of the previous-stage scan line Sn−1, or may be electrically connected thereto. Alternatively, the bypass control line GB may be a portion of the scan line Sn, or may be electrically connected thereto.

The scan line Sn is connected to the gate driver to transfer a scan signal to the second transistor T2 and the third transistor T3. The previous-stage scan line Sn−1 is connected to the gate driver to transfer a previous-stage scan signal, applied to a pixel PX disposed at a previous stage, to the fourth transistor T4. The light emission control line EM is connected to an emission controller, to transfer an emission control signal for controlling a time during which the light emitting diode LED emits light, to the fifth transistor T5 and the sixth transistor T6. The bypass control line GB transfers a bypass signal to the seventh transistor T7.

A data line Dm is a wire for transferring a data voltage generated by the data driver, and luminance of the light emitting device LED changes depending on the data voltage. The driving voltage line ELVDD applies a driving voltage. The initialization voltage line Vint transfers an initialization voltage for initializing the driving transistor T1. The common voltage line (ELVSS) applies a common voltage. Constant voltages may be applied to the driving voltage line ELVDD, the initialization voltage line Vint, and the common voltage line ELVSS, respectively.

Hereinafter, the transistors will be described.

The driving transistor T1 is a transistor that adjusts a current output depending on an applied data voltage. An output driving current Id is applied to the light emitting diode LED to adjust brightness of the light emitting diode LED depending on the data voltage. To this end, a first electrode S1 of the driving transistor T1 is disposed to receive the driving voltage. The first electrode S1 is connected to the driving voltage line ELVDD via the fifth transistor T5. In addition, the first electrode S1 of the driving transistor T1 is also connected to the second electrode D2 of the second transistor T2, so that the data voltage is also applied thereto. A second electrode D1 (output electrode) of the driving transistor T1 is disposed to be able to output a current to the light emitting diode LED. The second electrode D1 of the driving transistor T1 is connected to an anode of the light emitting diode LED via the sixth transistor T6. A gate electrode G1 is connected with an electrode (second storage electrode E2) of the storage capacitor Cst. Accordingly, a voltage of the gate electrode G1 varies depending on a voltage stored in the storage capacitor Cst, and thus the driving current Id output by the driving transistor T1 varies.

The second transistor T2 is a transistor that receives a data voltage into the pixel PX. A gate electrode G2 thereof is connected to the scan line Sn, and a first electrode S2 thereof is connected to the data line Dm. The second electrode D2 of the second transistor T2 is connected to the first electrode S1 of the driving transistor T1. When the second transistor T2 is turned on depending on the scan signal Sn transferred through the scan line 151, the data voltage transferred through the data line Dm is transferred to the first electrode S1 of the driving transistor T1.

The third transistor T3 serves to allow a compensation voltage (Dm+Vth), obtained while the data voltage is changed through the driving transistor T1, to be transferred to a second storage electrode E2 of the storage capacitor Cst. A gate electrode G3 thereof is connected to the scan line Sn, and a first electrode S3 thereof is connected to the second electrode D1 of the driving transistor T1. The second electrode D3 of the third transistor T3 is connected to a second storage electrode E2 of the storage capacitor Cst and the gate electrode G1 of the driving transistor T1. The third transistor T3 connects the gate electrode G1 and the second electrode D1 of the driving transistor T1 depending on the scan signal received through the scan line Sn, and it also connects the second electrode D1 of the driving transistor T1 and the second storage electrode E2 of the storage capacitor Cst.

The fourth transistor T4 serves to initialize the gate electrode G1 of the driving transistor T1 and the second storage electrode E2 of the storage capacitor Cst. A gate electrode G4 is connected to the previous-stage scan line Sn−1, and a first electrode S4 is connected to the initialization voltage line Vint. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transfers the initialization voltage to the gate electrode G1 of the driving transistor T1 and the second storage electrode E2 of the storage capacitor Cst depending on the previous-stage scan signal transferred through the previous-stage scan line Sn−1. Thus, the gate voltage of the gate electrode G1 of the driving transistor T1 and the storage capacitor Cst are initialized. The initialization voltage may be a voltage that has a low voltage value to turn on the driving transistor T1.

The fifth transistor T5 serves to transfer the driving voltage to the driving transistor T1. The gate electrode G5 is connected to the light emission control line EM, and the first electrode S5 is connected to the driving voltage line ELVDD. The second electrode D5 of the fifth transistor T5 is connected to the first electrode S1 of the driving transistor T1.

The sixth transistor T6 serves to transmit the driving current Id output from the driving transistor T1 to the light emitting diode LED. A gate electrode G6 is connected to the light emitting control line EM, and a first electrode S6 is connected to the second electrode D1 of the driving transistor T1. The second electrode D6 of the sixth transistor T6 is connected to an anode of the light emitting diode LED.

The fifth transistor T5 and the sixth transistor T6 are simultaneously turned on by the light emitting control signal received through the light emitting control line EM. When the driving voltage is applied to the first electrode S1 of the driving transistor T1 through the fifth transistor T5, the driving transistor T1 outputs the driving current Id according to a voltage (i.e., a voltage of the second storage electrode E2 of the storage capacitor Cst) of the gate electrode G1 of the driving transistor T1. The output driving current Id is transmitted to the light emitting diode LED through the sixth transistor T6. The light emitting diode LED emits light as a current $I_{led}$ flows therethrough.

The seventh transistor T7 serves to initialize the anode of the light emitting diode LED. A gate electrode G7 is connected to the bypass control line GB, a first electrode S7 is connected to the anode of the light emitting diode LED, and a second electrode D7 is connected to the initialization voltage line Vint. The bypass control line GB may be connected to the previous-stage scan line Sn−1, and the bypass signal is the same timing signal as the previous-stage scan signal. The bypass control line GB may not be connected to the previous-stage scan line Sn−1, and may transfer a separate signal from the previous-stage scan signal Sn−1. When the seventh transistor T7 is turned on by the bypass signal GB, the initialization voltage is applied to the anode of the light emitting diode LED to initialize it.

A first storage electrode E1 of the storage capacitor Cst is connected to the driving voltage line ELVDD, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1, and it receives the data voltage through the second electrode D3 of the third transistor T3, or receives the initializing voltage through the second electrode D4 of the fourth transistor T4.

On the other hand, an anode of the light emitting diode LED is connected to the second electrode D6 of the sixth transistor T6 and the first electrode S7 of the seventh transistor T7, and a cathode thereof is connected to the common voltage line ELVSS for transmitting the common voltage.

In the exemplary embodiment of the present invention depicted in FIG. 15, the pixel circuit includes seven transistors T1 to T7 and one capacitor Cst, but the present invention is not limited thereto, and numbers of the transistors and the capacitors and connections therebetween may be variously modified.

The first transistor T1 as the driving transistor of FIG. 15 may be the second transistor TR2 as the driving transistor of FIG. 1 to FIG. 13. In addition, the second transistor T2 or the third transistor T3 as the switching transistor of FIG. 15 may be the first transistor TR1 as the switching transistor of FIG. 1 to FIG. 13.

While exemplary embodiments of the present invention have been shown and described above it will be apparent to those of ordinary skill in the art that modifications and variations can be made without departing from the spirit and scope of the present invention, as defined by the appended claims.

What is claimed is:

1. A display device, comprising:
a substrate;
a second semiconductor layer disposed on the substrate, the second semiconductor layer including Si;
a second gate lower electrode overlaps a channel region of the second semiconductor layer;
a second gate insulating layer disposed on the second gate lower electrode;
a second gate upper electrode and an electrode disposed on the second gate insulating layer;
a first auxiliary layer disposed on the second gate upper electrode and the electrode;
a first semiconductor layer overlaps the electrode, the first semiconductor layer includes an oxide semiconductor; and
a first gate electrode overlaps a channel region of the first semiconductor layer,
wherein the first auxiliary layer includes SiNx:F, and
the second gate upper electrode and the electrode are disposed on the same layer.

2. The display device of claim 1, wherein
a content of the at least one material selected from F, Cl, and C included in the first auxiliary layer is three times or more greater than that of one or materials of F, Cl, and C included in the second gate insulating layer.

3. The display device of claim 1, wherein
a thickness of the first auxiliary layer is in a range of 1 Å to 100 Å.

4. The display device of claim 1, wherein
the second gate upper electrode and the electrode include a same material.

5. The display device of claim 1, wherein
the electrode overlaps the first semiconductor layer and has an area similar to that of the first semiconductor layer.

6. The display device of claim 1, further comprising:
a third gate insulating layer disposed between the first semiconductor layer and the first gate electrode,
wherein the third gate insulating layer overlaps the first semiconductor layer.

7. The display device of claim 1, further comprising:
a third gate insulating layer disposed between the first semiconductor layer and the first gate electrode,
wherein the third gate insulating layer overlaps the channel region of the first semiconductor layer and does not overlap a source region and a drain region of the first semiconductor layer.

8. The display device of claim 1, further comprising:
a second auxiliary layer disposed on the first gate electrode,
wherein the second auxiliary layer includes an insulating layer including at least one compound selected from SiNx, SiOx, and SiON, and at least one material selected from F, Cl, and C, and
a content of the at least one material selected from F, Cl, and C included in the second auxiliary layer is three times or more greater than at least one material selected from F, Cl, and C included in the second gate insulating layer.

9. The display device of claim 8, further comprising:
a third gate insulating layer disposed between the first semiconductor layer and the first gate electrode,
wherein the third gate insulating layer overlaps the first semiconductor layer.

10. The display device of claim 8, further comprising:
a third gate insulating layer disposed between the first semiconductor layer and the first gate electrode,
wherein the third gate insulating layer overlaps the channel region of the first semiconductor layer and does not overlap a source region and a drain region of the first semiconductor layer.

11. The display device of claim 1, further comprising:
a third auxiliary layer disposed between the second gate lower electrode and the second gate insulating layer,
wherein the third auxiliary layer includes an insulating layer including at least one compound selected from SiNx, SiOx, and SiON, and at least one material selected from F, Cl, and C, and
a content of the at least one material selected from F, Cl, and C included in the third auxiliary layer is three times or more greater than that of one or materials of F, Cl, and C included in the second gate insulating layer.

12. The display device of claim 11, further comprising:
a third gate insulating layer disposed between the first semiconductor layer and the first gate electrode,
wherein the third gate insulating layer overlaps the first semiconductor layer.

13. The display device of claim 11, further comprising:
a third gate insulating layer disposed between the first semiconductor layer and the first gate electrode,
wherein the third gate insulating layer overlaps the channel region of the first semiconductor layer and does not overlap a source region and a drain region of the first semiconductor layer.

14. The display device of claim 1, further comprising:
a second auxiliary layer disposed on the first gate electrode; and a third auxiliary layer disposed between the second gate lower electrode and the second gate insulating layer,
wherein each of the second auxiliary layer and the third auxiliary layer includes an insulating layer including at least one compound selected from SiNx, SiOx, and SION, and at least one material selected from F, Cl, and C, and
a content of the at least one material selected from F, Cl, and C included in the second auxiliary layer and the third auxiliary layer is three times or more greater than at least one material selected from F, Cl, and C included in the second gate insulating layer.

15. The display device of claim 14, further comprising
a third gate insulating layer disposed between the first semiconductor layer and the first gate electrode,
wherein the third gate insulating layer overlaps the first semiconductor layer.

16. The display device of claim 14, further comprising
a third gate insulating layer disposed between the first semiconductor layer and the first gate electrode,
wherein the third gate insulating layer overlaps the channel region of the first semiconductor layer and does not overlap a source region and a drain region of the first semiconductor layer.

* * * * *